(12) United States Patent
Xiao et al.

(10) Patent No.: US 6,891,191 B2
(45) Date of Patent: May 10, 2005

(54) ORGANIC SEMICONDUCTOR DEVICES AND METHODS OF FABRICATION

(75) Inventors: Steven Xiao, Laval (CA); Chunong Qiu, Brossard (CA); Cindy Xing Qiu, Brossard (CA)

(73) Assignee: Organic Vision Inc., Brossard (CA)

( * ) Notice: Subject to any disclaimer, the term of this patent is extended or adjusted under 35 U.S.C. 154(b) by 39 days.

(21) Appl. No.: 10/652,959

(22) Filed: Sep. 2, 2003

(65) Prior Publication Data

US 2005/0045874 A1 Mar. 3, 2005

(51) Int. Cl.$^7$ .............................................. H01L 35/24
(52) U.S. Cl. .......................................... 257/40; 438/48
(58) Field of Search ............................................ 257/40

(56) References Cited

U.S. PATENT DOCUMENTS 5,093,698 A * 3/1992 Egusa .......................... 257/40
6,441,395 B1 * 8/2002 Yu et al. ....................... 257/40

OTHER PUBLICATIONS

J.M. Shaw, P.F. Seidler, IBM Journal of Research & Development, 45(1), 3(2001).
C. T. Tang, Applied Physics Letter, 48(86), 183 (1986).
G. Yu and A.J. Heeger, Journal of Applied Physics, 78(7), 4510(1995).
N. S. Sariciftci, L. Smilowitz, A. J. Heeger, and F. Wudl, Science 258, 1474 (1992).
W.H.Huynh, J.J.Dittmer, and A.P. Alivisatos, Science, 295: 2425 (2002).

* cited by examiner

Primary Examiner—David Nelms
Assistant Examiner—Thao P. Le

(57) ABSTRACT

The present invention discloses a vertical junction structure with multi-PN channels, which provides a maximum interface between p-type and n-type materials in order to assist the charge separation, and offers continuous phases in both p- and n-type materials for charge transport in opposite directions.

The present invention also provides methods for constructing the device structures. The main steps include 1) assembling a porous structure or a framework with semiconductor materials of one conduction type on a first electrode, 2) filling pores or coating the framework made from the materials in step 1 with semiconductors or precursors of conducting polymer of a opposite conduction type, 3) chemically and physically treating the system to form closed packed multi-PN channels.

10 Claims, 7 Drawing Sheets

Prior art

ORGANIC SEMICONDUCTOR DEVICES AND METHODS OF FABRICATION

FIELD OF THE INVENTION

This invention relates to structures of organic semiconductor devices and the methods of fabrication the same.

BACKGROUND OF THE INVENTION

Organic semiconductors, conjugating polymers in particular, have electronic properties of inorganic semiconductors and engineering properties of plastic. They have been employed in many electro-opto applications, including light emitting diodes, solar cells, sensors, transistors and devices for data storage [J. M. Shaw, P. F. Seidler, *IBM Journal of Research & Development*, 45(1), 3(2001)].

Figure 1:
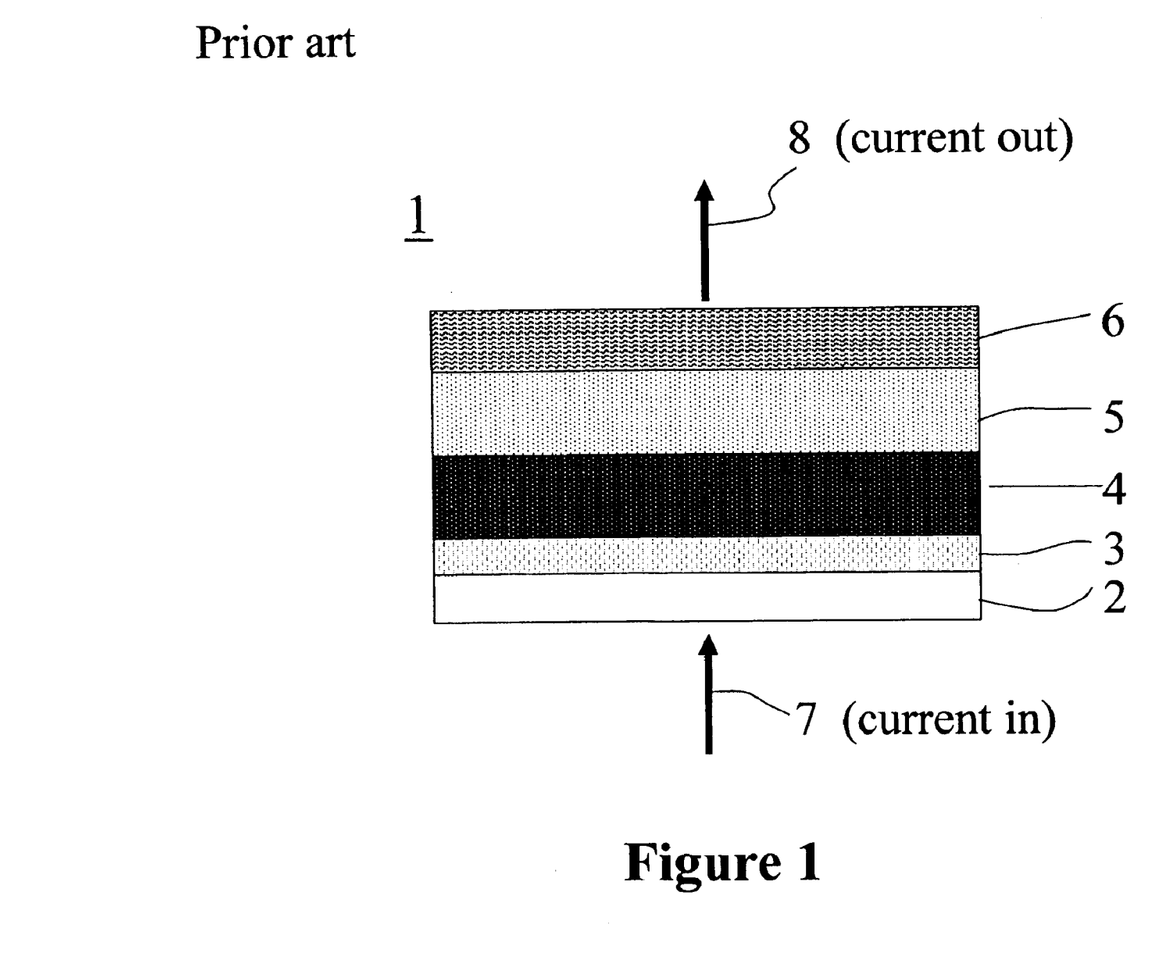
FIG. 1 shows a schematic cross-sectional view of a bilayer PN junction semiconductor device.

A simple organic semiconductor device may consist of one layer of electro-opto active organic material sandwiched between two electrodes. However, the inherent charge mobilities of organic semiconductors are generally much lower than that of inorganic semiconductors, which ultimately results in difficulties in configuring a PN junction device with organic semiconductors. For example, in configuring a photovoltaic device, an inorganic semiconductor based solar cell can yield an efficiency of 15% or higher with a simple PN junction structure (as shown in FIG. 1). But, for a similarly structured device made of organic semiconductors, the efficiency is only about 1% [C. T. Tang, *Applied Physics Letter*, 48(86), 183 (1986)].

To facilitate charge separation and transport in organic semiconductor based devices, various heterojunction systems have been proposed and experimented. These systems include a physical blend of a p-type polymer with a n-type polymer [G. Yu and A. J. Heeger, Journal of Applied Physics, 78(7), 4510(1995)], a blend of fullerene or its derivatives into conducting polymers [N. S. Sariciftci, L. Smilowitz, A. J. Heeger, and F. Wudl, *Science* 258, 1474 (1992).], and a more recent hybrid system of inorganic nanoparticles or nano-rod into conducting polymers [W. H. Huynh, J. J. Dittmer, and A. P. Alivisatos, *Science*, 295: 2425(2002)]. These hetrojunction systems have demonstrated some improvements comparing to a simple bi-layer configuration. However, the efficiency and operation stability of these hetrojunction systems are still far below what have been achieved with inorganic semiconductors based devices, not to mention the fabrication complexity of fullerence derivatives or nano-rod of inorganic semiconductors. This is mainly because of the unsolved fundamental problems with organic semiconductor materials in these systems. The systems are still in disorder in the nano-scale or the molecular level due to phase separation and discontinuous charge transport media. In either the fullerence derivative-doped polymer system or the inorganic semiconductor nanoparticle (or nano-rod) polymer hybrid system, in order to be colleted at the two electrodes, charges still have to hop from one molecule (or one particle) to another repeatedly. In this mode of transport, two molecules have to be really close and well oriented in order to allow for efficient charge hopping. Moreover, in these blended systems, which behave like "meat-balls in spaghetti", phase separation may occur in fabrication stage and in operation stage. The phase separation may cause dimensional instability and performance degradation. Therefore, how to maximize charge transport and enhance dimensional stability is a critical issue for improve the performance of an organic semiconducting material based device, solar cell in particularly.

OBJECTIVE OF THE INVENTION

One objective of the present invention is to configure a semiconductor device structure, which provides a maximum interface area between p-type and n-type materials in order to assist the charge separation, and offers continuous phases in both p- and n-type materials for charge transport in opposite directions.

Another objective of the present invention is to teach methods in constructing the invented device structures.

DETAILED DESCRIPTION OF THE PREFERRED EMBODIMENTS

The configuration of an ordinary inorganic based semiconductor device (1), as schematically shown in FIG. 1, consists a substrate (2) and an anode (3) which is deposited on the substrate (2), a p-type semiconductor layer (4), an n-type semiconductor layer (5) and a cathode (6). The fabrication of these layers allows a sandwiched structure to be formed. Since all layers in this structure are planar, it is often called a planar junction. In a planar junction, the active junction area is determined by the area of the layers and hence the currents available are limited. As shown in FIG. 1 when the planar junction is operating, the active area of the p-type semiconductor layer (4) or the n-type semiconductor layer (5) is defined as the active area through which an input current (7) flows from anode (3) to cathode (6) to produce an output current (8) at a given voltage. For practical applications, it is advantageous to increase the current flowing through the junctions at a given voltage, specifically for the ones based on organic semiconductors. This can be achieved by increasing the active area of the semiconductor device, which is especially true for devices involving organic semiconductors where the mobilities of the carries are often low.

Figure 2:
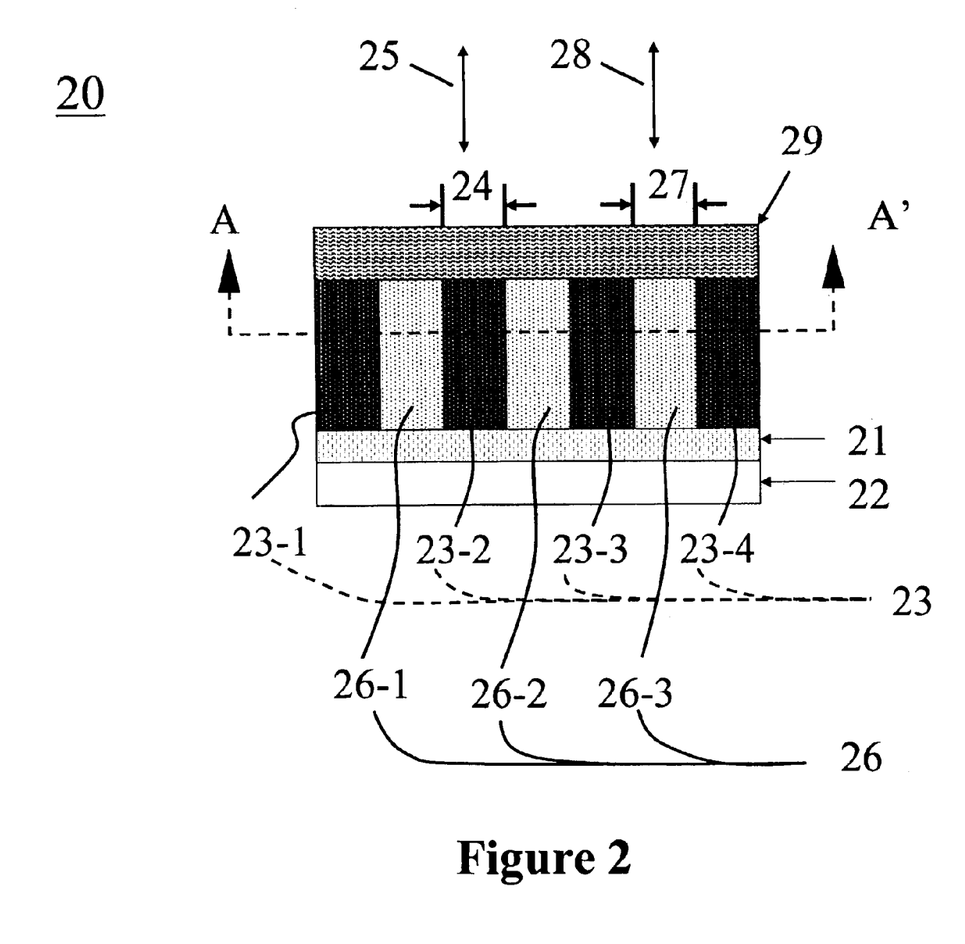
FIG. 2 shows a schematic cross-sectional view of a semiconductor device 20 with multi-PN channels as disclosed in this invention.

According to one embodiment of the present invention as shown in FIG. 2, the current value or the active area of a junction is increased by adopting a vertical junction structure (20) with multi-PN channels. In this stricture (20), a first electrode (or anode) (21), is deposited on a substrate (22), which could be a glass or a plastic layer. After the anode (21) deposition, a vertical first periodic structure (23) (herein after called the first periodic structure) with several first elements (23-1, 23-2, 23-3, and 23-4, in FIG. 2) is created. The first periodic structure (23) is preferably an n-type semiconductor. However, it is also be possible to select a first periodic structure (23) that is a p-type semiconductor. The first periodic structure (23) consists of several first elements (23-1, 23-2, 23-3, and 23-4) with a first width (24) and a first major axis (25). Between adjacent walls of the first periodic structure (23), cavities (or channels) are formed. After the formation of the first periodic structure (23), a vertical second periodic structure (26) (herein after called second periodic structure) with several second elements (26-1, 26-2, and 26-3 in FIG. 2) is formed into the cavities (or channels) created by the first periodic structure (23). The second periodic structure (26) should be a p-type semiconductor when an n-type first periodic structure (23) is selected. It is noted that each of the second elements (26-1, 262, and 26-3) in the second periodic structure (26) has a second width of (27) and a second major axis (28) that is substantially parallel to the first major axis (25) of the first periodic structure (23). It should be noted that instead of using an n-type semiconductor for the first periodic structure (23), p-type materials could be employed. In this case, the second periodic structure (26) will be selected from a group of n-type semiconductors. According to this invention, a second electrode (29) is deposited to complete the vertical junction structure (20) with multi-PN channels.

In FIG. 2, the substrate (22) may be selected from a group of rigid materials such as glass, alumina, aluminium, brass, stainless steel sheet, etc., or from a group of flexible materials such as polymeric sheets like polyester, polycarbonate, polyamide, polyacrylate and textile fabrics, etc. The selection of substrates depends on the desired functionality of the devices. For example, in the case of photovoltaic application or other optical devices, the substrate (22) shall be transparent in order to permit transmission of optical power. In such cases, glass substrates are preferable. The thickness of the substrate (22) may vary from 0.2 $\mu$m to 2 mm, but preferably in a range of 1 $\mu$m to 100 $\mu$m.

In FIG. 2, the first electrode (21) and the second electrode (29) may be selected from conducting metal oxides, metals or alloys. Their energy levels and electrical conductivity shall be considered to facilitate the charge transport. In the case of photovoltaic application, low work function materials such as metals (lithium, magnesium, calcium, nickel, aluminium etc.), alloys and salts (LiF, $CaF_2$, $MgF_2$, etc.) are preferable for the second electrode (29) to act as the cathode, whereas high work function materials such as metals (platinum, gold, copper, silver, etc.), and metallic oxides (ZnO, $TiO_2$, ITO, etc.) are preferred for the first electrode or anode (21). Optical transmission properties and compatibility of the electrodes (21, 29) shall be considered according to the selection of the substrate (22) and functionality of the device (20) to be fabricated. For instance in the case of solar cells, the substrate (22) may be glass, a transparent and electrically conductive material like ITO is more preferable for the anode (21). Still more preferably, a commercially available ITO coated glass may be selected for making up an integrated part of (21) and (22). The thickness of the first electrode (21) and the second electrode (29) may vary from 0.05 $\mu$m to 5 $\mu$m, but preferably in a range from 0.1 $\mu$m to 2 $\mu$m. It should be pointed out that in the above description, the first electrode (21) is an anode and the second electrode (29) is a cathode. In practical cases, their roles can well be interchanged so that the first electrode (21) could be a cathode whereas the second electrode (29) is an anode.

According to the present invention, in FIG. 2, (23) and (26) represent respectively the p-type and n-type semiconductor materials, where at least one of these semiconductive materials (23, 26) contains an organic compound, a mixture of organic compounds or a mixture of inorganic compounds and organic compounds.

Organic compounds with controllable structures and electro-opto activity may be a class of small molecules, oligomers, dendrimers, macromolecules (polymer) or a mixture of these chemicals. It is not the scope of this invention to list all these semiconducting organic compounds. The following organic materials are classified below for the proposal to exemplify this invention only.

For instance, small molecules having semi-conductive properties may be metal complexes (for example, metallic hydroxyquinlates, metallic phthalocyanates, and metallic porphinates), aromatic compounds (for example, pentance, anthracene, rubenes, pyrene, tetracene, and porphine), heteroatom containing compounds (phenyl amine, phenyl diamine, oxadiazole, trizole, carbozole, quinacridone, cyanine dyes).

For instance, oligomer or dendrimers having semi-conductive properties may be based on aromatics, furan, thiophene, and amine. For facilitating charge transport in the device (20), thiophene oligomers like sexithiophene may be preferable.

For instance, macromolecules or polymers having semi-conductive properties are those with conjugated backbones. These polymers may be selected from a group of polyarylenes, polyarylenevinylenes, polyaryleneethylene, polyfluorenes, polyanilines, polythiophenes, polypyrroles, and any conjugated co-polymers.

In FIG. 2, (23) and (26) represent the p-type and n-type semiconducting materials, whereas one of these semiconductive materials may be an inorganic compound or a mixture of inorganic compounds. Inorganic semiconductors include silicone, metallic oxides, metallic sulfides (for example, CdS), metallic selinates (for example CdSe) and others. Their energy gap and charge mobility may be varied by doping, morphology engineering, and particle size controlling. Certain porous silicates, aluminum silicates, aluminum phosphates with defined pore or channel structures may have charge or ion transport properties of a semiconducting material as well. These later groups of materials are well known to catalysis, solid electrolyte, and membrane separation industries.

In FIG. 2, the first periodic structure (23) and the second periodic structure (26) represent p-type and n-type semiconducting materials, whereas the first elements (23-1, 23-2, 23-3, and 23-4) and the second elements (26-1, 26-2, and 26-3) are assembled adjacent to each other in an alternating fashion, and each element consists of one continuous phase of its own. Of these continuous phases, the first elements (23-1, 23-2, 23-3, and 23-4) (p-type) must contact anode (21) whilst the second elements (26-1, 26-2, and 26-3) (n-type) must contact the cathode (29).

It should be noted that there is no restriction to the geometry of the first element (23-1, 23-2, 23-3, and 23-4) (p-type) or the second elements (26-1, 26-2, and 26-3) (n-type). However, to maximize the interface between adjacent first elements (23-1, 23-2, 23-3, and 23-4) and second elements (26-1, 26-2, and 26-3) or the first periodic structure (23) and the second periodic structure (26), the diameter (or width 24 or 27) of each element shall be as small as possible. In the case of photovoltaic applications, where effective charge separation between two phases is required, the diameter of each element is preferably to be in a range of 1 nm to 100 nm, more preferably, in a range of 2 run to 50 nm. Depending on the assembling method, they could be in the shapes of a rod, a string, a cone, a tube, a grid, or a web.

Moreover, either the first periodic structure (23) consisting of the first elements (23-1, 23-2, 23-3, and 234) or the second periodic structure (26) consisting of the second elements (26-1, 26-2, and 26-3) may form an integrated solid structure to allow another periodic structure to penetrate it.

Figure 3:
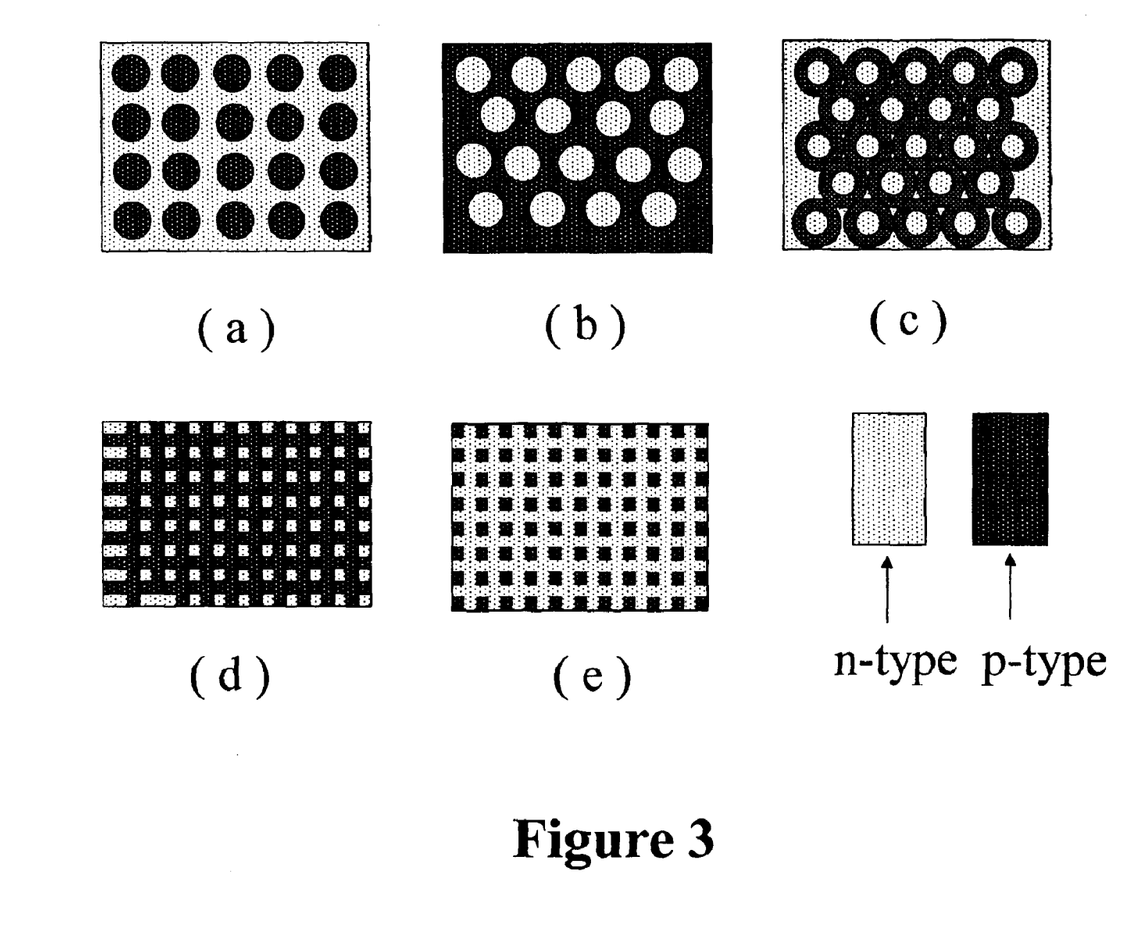
FIG. 3 shows top views of some configuration examples for multi-PN channels as disclosed in this invention.

The first periodic structure (23) depicted in FIG. 2 could be achieved using various methods and with different cross-sectional structures. FIG. 3 shows the cross-sectional views of a vertical junction structure 20 taken along A-A' in FIG. 2, with several possible cross-sectional structures. In FIG. 3(a), a cross-section of p-type materials in a form of nano-rods embedded in a matrix of n-type materials is shown, while FIG. 3(b) gives a different structure with n-type nano-rods surrounded by p-type materials. In FIG. 3(c), p-type materials are configured in a form of nano-tubes on which n-type materials were coated (both inner and outer walls). In FIG. 3(d), n-type materials are filled into a framework built with p-type materials, whereas FIG. 3(e) illustrates a similar configuration, except that the two types of semiconductive materials have been reversed. There are more possible configurations where the first periodic structure and the second periodic structure are allowed to arrange in alternate ways and each periodic structure consists of materials with a continuous phase of its own type.

Figure 4:
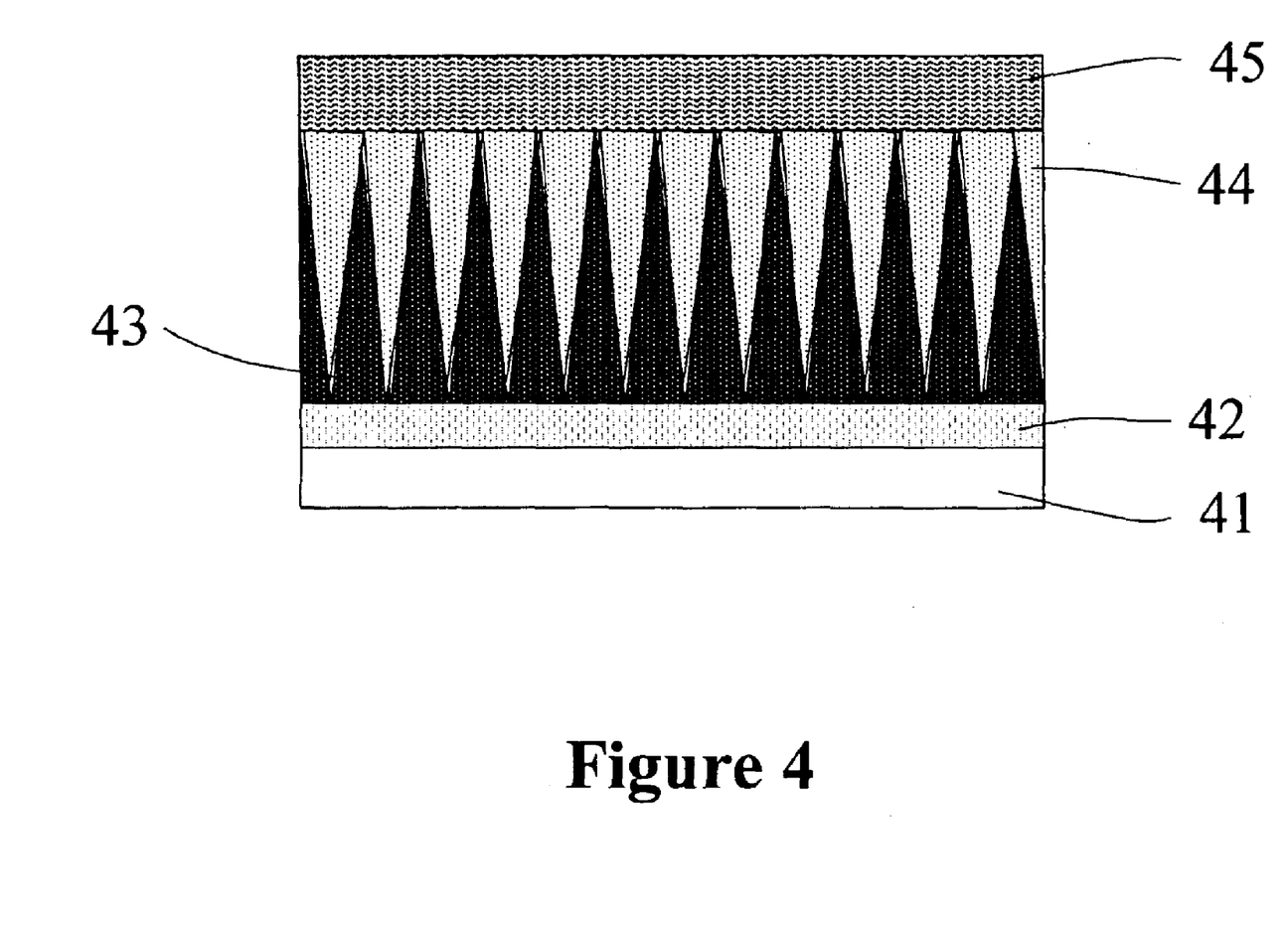
FIG. 4 is a schematic diagram showing a configuration example of multi-PN channels, where contacts between the p-channels and the cathode and between the n-channels and the anode are minimized.

It is thus clear from the above descriptions and from FIG. 2 that either the first elements (23-1, 23-2, 23-3, and 23-4) (p-type) or the second elements (26-1, 26-2, and 26-3) (n-type) are selected to be continuous phases in order to maximize charge transporting. The p-type materials (23) are to transport positive charges to/from the anode (21) whilst the n-type materials (26) are to transport negative charges (electrons) to/from the cathode (29). Therefore, close contacts between the p-type materials (23) and the anode (21) are essential for transporting positive charges, and similarly, close contacts between the n-type materials (26) and the cathode (29) are required for transporting negative charges. However, direct contacts either between the p-type materials (23) and the cathode (29) or between the n-type (26) materials and the anode (21) may not be necessary. In some cases, the contact may not be preferable depending on functionality of the devices required and materials employed. FIG. 4 presents a possible structure configuration on a substrate (41), where the contacts between p-type material (43) and the cathode (45) are minimized by gradually reduced diameters of the p-type material elements toward the cathode (45). Similarly, gradually reducing the diameters of the n-type material elements from the cathode to the anode (42) minimizes the contacts between the n-type materials (44) and the anode (42).

Figure 5:
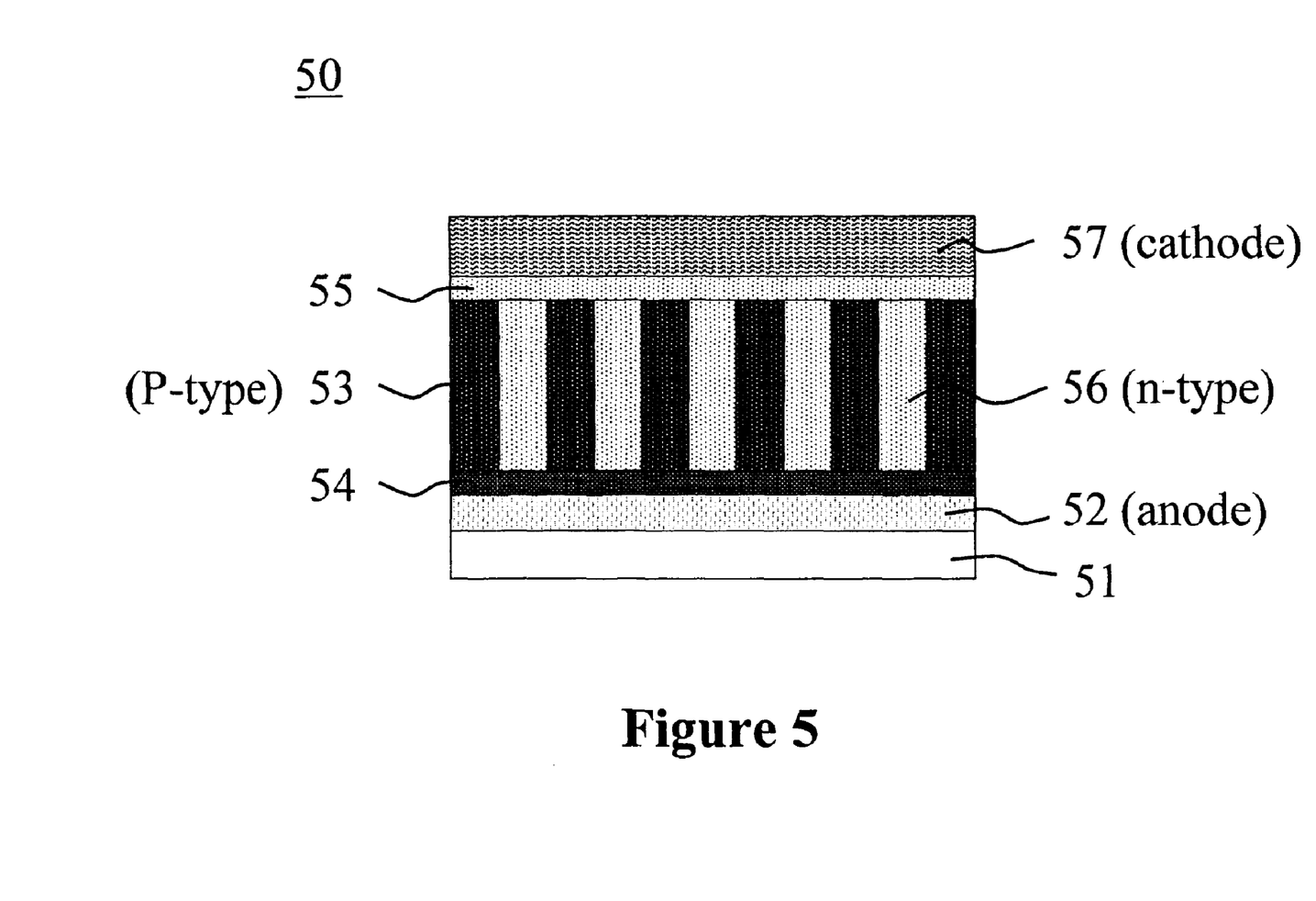
FIG. 5 is a schematic diagram showing a multi-PN channel device with an extended transport enhancement structure according to this invention.

According to another embodiment in this invention, in order to enhance the current transport of a vertical junction structure (50) on a substrate (51), between the anode (52) and the first periodic structure (p-type) (53), a first contact layer (54) is inserted to increase contacts for an enhanced transport of positive charges, whereas a second contact layer (55) is inserted to increase contacts between n-type materials (56) and the cathode (57) and to enhance transport of negative charges. On the other hand, direct electrical contacts either between the first periodic structure (53, p-type materials) and the second electrode (57, cathode) or between the second periodic structure (56, n-type materials) and the first electrode (52, anode) are not necessary. In some cases, it may be preferable not to allow these direct electrical contacts, depending on functionality of the devices required and materials employed. In deed, as shown in FIG. 5, the first contact layer (54) is preferably to be a thin layer of materials with high hole mobility, which is inserted between the anode (52) and the multi-PN channels. The second contact layer (55) is preferably a thin layer of materials with high electron mobility, which is inserted between the cathode (57) and the multi-PN channels. More preferably, the first contact layer (54) and the second contact layer (55) are to have functionality to transport one type of charges and to block the other type of charges at the same time. For instance, the first contact layer (54) shall promote transporting of positive charges and block transporting of negative charges, whilst the second contact layer (55) shall have opposite characteristics with respect to charge transport behavior of the first contact layer (54). These inserted contact layers for charge transport may be inorganic compounds, organic compounds, or a mixture of inorganic materials and organic materials. Furthermore, as a positive charge transporting material, the first contact layer (54) may have the same or different chemical composition with respect to (53). Similarly, as a negative charge transport material, the second contact layer (55) may have the same or different chemical composition from (56). Preferably, the thickness of the first contact layer (54) and the second contact layer (55) is less than 10 $\mu$m. More preferably, the thickness of these layers is less than 0.1 $\mu$m.

It is thus evident from this invention that the vertical junction structure with multi-PN channels will provide a maximum interface area between the p-type and the n-type materials in order to assist the charge separation, and provide continuous phases for both types of material to facilitate the charge transport in opposite direction along each phase. It should be mentioned that the above exemplified configurations are presented for illustration purposes and shall not be considered as constraints to the scope of this invention.

Figure 6:
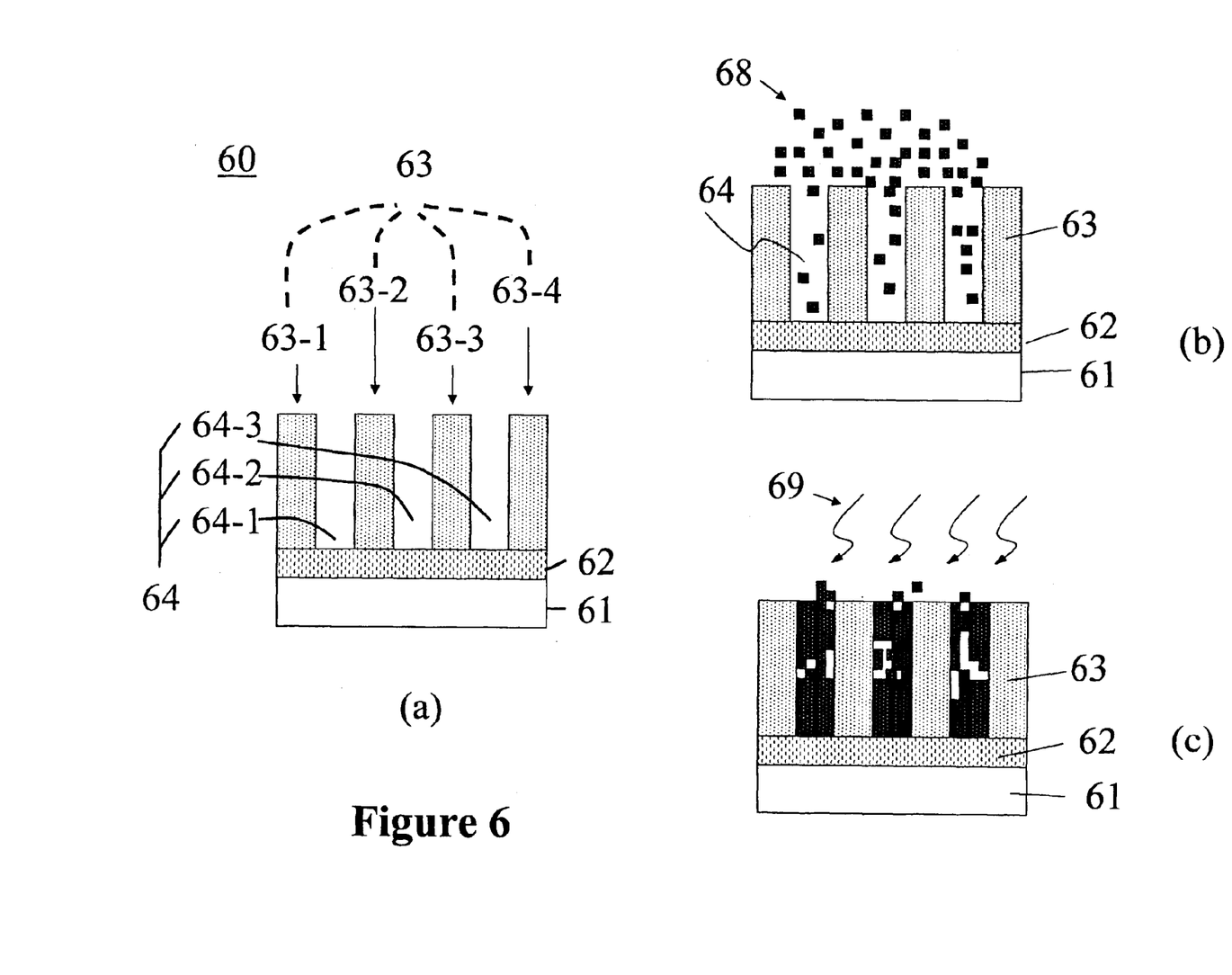
FIG. 6 is a schematic diagram showing fabrication steps for a multi-PN channel device according to this invention.

It is yet another embodiment of this invention to provide methods to construct the devices disclosed in the above-configured device. Since the preparation of anode and cathode are known prior arts, this embodiment will only detail the method to fabricate the first periodic structure and the second periodic structure with vertical junctions or multi-channels. The fabrication of the periodic structures with vertical junctions may be divided, according to this invention, into three basic steps as schematically shown in FIG. 6: (a) assembling a porous first periodic structure (or a framework) (63) with a n-type or p-type semiconductor materials on a cathode (62) which is deposited on a substrate (61); (b) filling pores or cavities between adjacent elements in the first periodic structure (63) or coating the framework made from the materials from step (a), with semiconductors of an opposite type or precursors of conducting polymers; and (c) chemically and physically treating the system to form closely packed integrated periodic structure with vertical junctions or multi-PN channels.

In step (a), a porous structure or a framework (60) of one type of semiconductive materials is constructed by molecular assembling, direct depositing of a porous material like silicates, molecular sieves and porous clay, or draining holes (channels) from a solid pre-coated layer. As shown in FIG. 6(a), a porous structure (60) is formed on a substrate (61) with a cathode (62). It consists of elements (63-1, 63-2, 63-3, and 63-4) forming the porous structure with channels (64-1, 64-2, and 64-3). As an example, zeolite membranes with features similar to a honeycomb can be adopted and built on cathode materials (62), like ITO by a thermogel processing or preferably by spin coating from a zeolite colloid. Depending on its chemical composition, this zeolite membrane can act as an n-type semiconductor. In another example, a semiconductive polymer can be first coated on cathode to form a solid thin film, and then pores or channels can be formed in certain pattern with nano-imprinting technology. It is also possible to construct directly the first periodic structure (63) with a pattern deposition method such as screen-printing, ink jetting, vapor deposition through mask, thermal transfer printing and other known techniques.

In step (b), semiconductor materials or precursors (68) of an opposite conduction type are filled into the pores, channels or cavities (64-1, 64-2, and 64-3) made from the first type of semiconductive materials in step (a). If in step (a), the first periodic structure (63) was built from n-type semiconductors, then p-type semiconductive materials (68) will be used, or vice versa. Small molecules of the semiconductor materials of opposite conducting type are preferably adopted to fill into the channels (64) by vapor deposition, thermal diffusion and other known techniques. To fill the channels (64) with conducting macromolecules (or called conducting polymers) will be difficult even though these polymers can dissolve in a good solvent, because polymeric chains are often oriented in coil forms. In such case, polymer precursors or monomers are preferably introduced into the channels (64) at this stage, followed by initiating the polymerization inside the channels (64) by light or electron beam irritation, heating or chemical vapor treatment as described in step (c) below.

In step (c), a chemical or physical treatment step is performed. This step will allow two types of semiconductive material introduced in steps (a) and (b), respectively, to form two solid continuous phases. Practically, when the second type of the semiconductive materials (68) are introduced into the frameworks of the first type of semiconductive materials (63) in a monomer or precursor form (68), heating, UV-irritation and electron beam (69) can be employed to polymerize these precursors (68) depending on the nature of precursors. In synthesis, such a methodology to fill the big molecules into a narrow pore is sometime referred to "Ship in a bottle" approach.

The final device can now be completed after depositing cathode materials on the formed multi-channels via vapor deposition, coating, printing and other known techniques. A protective layer may be applied to the final device for improving device lifetime.

Figure 7:
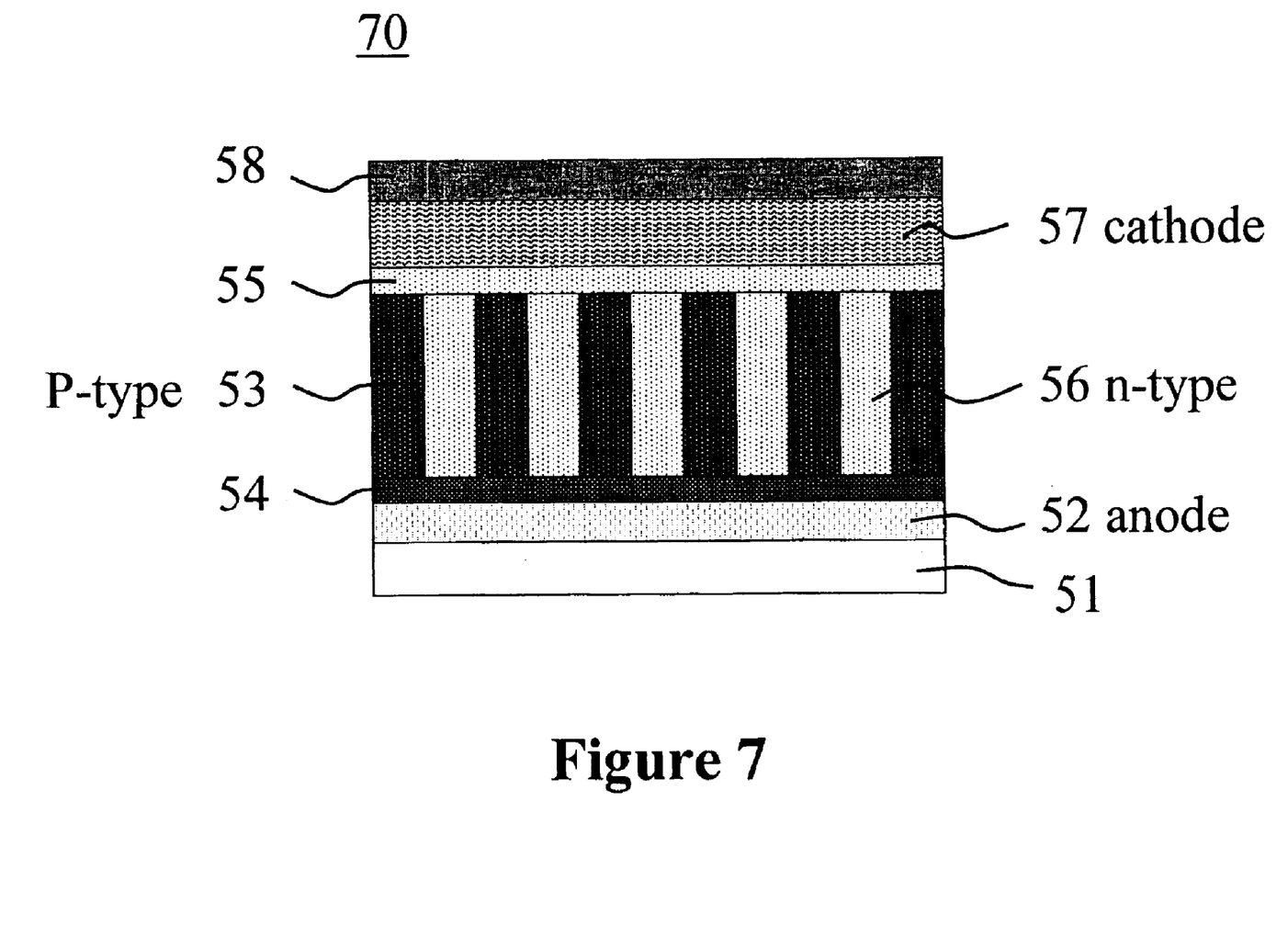
FIG. 7 shows a completed multi-PN channel device with a second substrate sealed on top.

Since at least one of the first elements and the second elements is organic semiconductor or contains organic semiconductor, the vertical junction structure may be sensitive to oxygen or water vapor. In order to improve the lifetime stability of the devices, it is preferable to incorporate a second substrate on the structure (20) or (50) shown in FIG. 2 and FIG. 5. FIG. 7 provides an example where a second substrate (58) is applied to the exampled device 50 of FIG. 5 to yield a final device (70). To further protect this organic semiconductor based device, adhesive materials may be applied to the edges of the combined structure, defined by the first substrate (51) and the second substrate (58), under either vacuum or an inert atmosphere. In this manner, the vertical junction structure (70) is enclosed in an environment devoid of oxygen or water vapor. Hence, the lifetime stability of the present vertical junction structure (70) may be improved.

In the subsequent part of this invention, some examples on the construction of the invented device structures are given. It is clear that these examples are presented for illustration purposes and not to limit the scope of this invention.

EXAMPLES

Example 1

Formation of Zeolite Membrane by Steaming Method

Weigh about 0.610 g of sodium hydroxide pellets and finely grind the pellets with a mortar and pestle. Place this mixture in a 250 ml beaker, and add 2.01 g of water glass containing 40% silica in water and 1.01 g of tetrapropylammonium bromide. Mix with 5.0 ml distilled water, then add 1.0 ml of n-propylamine and mix the solution again.

Place 1.0 ml of a prepared 1 molar solution of aluminum sulfate along with about 0.05 ml of the concentrated sulfuric acid in a separate 50 ml beaker. Then add the first solution to this beaker as well. Add enough distilled water to raise the volume to about 25 ml, and mix the solution (26 ml total volume) on a stir plate for ten minutes, yield a stable homogeneous dispersion.

Spin coat the dispersion onto a pre-clean ITO glass to have a gel-like coat layer. Then place the whole part into a stainless steel tube and carefully steam it for 2 hours at a proper pressure.

After steaming, cool the sample to room temperature, and wash it thoroughly with sufficient amounts of water and then dry in a vacuum oven at 120° C. for 10 hours. Finally, calcine the sample in a high temperature oven at about 450° C. for 4 hours to remove the organic amines (used as template for pore formation) and yield a zeolite on ITO glass.

X-ray diffraction is used to determine the crystalline and structure, and found the formed membrane has a structure of zeolite ZSM-5 type. SEM is used to examine the membrane morphology, and found a membrane thickness of about 0.5 $\mu$m.

Example 2

Introduction of Conducting Polymers Precursor into Zeolite Membranes

The zeolite membrane on ITO glass obtained from example 1 is placed in a glass tube, aniline vapor in nitrogen media is pass through the tube for 4 hours, which introduce aniline molecules into pores of zeolite membrane.

Example 3

Formation of Conducting Polymers Inside Zeolite Membranes

Following example 2, hydrochloric acid vapor in nitrogen media is then passed through the glass tube with the sample obtained in Example 2. This initiates the polymerization of aniline molecules inside zeolite pores and forms conducting polyaniline inside zeolite channels.

Example 4

The Formation of first Periodic Element by Imprinting Technology

A commercial ITO-coated glass is pre-cleaned by a conventional technique. Then, a layer of PEDOT is then spin-coated onto the ITO-coated glass from a commercially available PEDOT (available from Bayer) solution. Solvent and water from PEDOT solution were removed by baking to yield a layer of ~100 nm PEDOT on ITO coated glass. Subsequently, a layer of MEH-PPV (available from Aldrich) was spun coated onto PEDOT layer from a 1% solution in toluene. Spin speed was adjusted to have a thickness of MEH-PPV layer about 500 nm. Toluene was again removed by baking; Finally, a part with layer structure of Glass/ITO/PEDOT/MEH-PPV was obtained.

A silicon dioxide mold was constructed by conventional lithography technology to have a periodic structure reflecting the structure of the periodic structure of the second element. In a nano-imprint machine, the mold was carefully stamped onto the MEH-PPV layer of the part obtained above. Pressure and temperature was controlled to have the mold penetrate the MEH-PPV layer to a depth of ~300 nm, and the mold stayed in the position for an appropriate period (2–10 minutes depend on other condition). After the removal of mold, the structure of mold was then duplicated in the MEH-PPV layer.

What is claimed is:

1. An organic electronic and opto-electronic device with an increased active junction area comprising,
   a substrate with a first electrode on a front surface of said substrate;
   a first periodic structure consisting of a plurality of first semiconductor elements of a first conducting type, at least a portion of said first periodic structure overlaps said first electrode;
   a second periodic structure consisting of a plurality of second semiconductor elements of a second conducting type, at least a portion of either said first semiconductor elements or said second semiconductor elements being an organic semiconductor, each of said first semiconductor elements is vertically adjacent to at least one of said second semiconductor elements; and
   a second electrode formed on top of said first periodic and said second periodic structure.

2. An organic electronic and opto-electronic device with an increased active junction area as defined in claim 1, wherein said first conducting type is p-type and said second conducting type is n-type.

3. An organic electronic and opto-electronic device with an increased active junction area as defined in claim 1, wherein said first conducting type is n-type and said second conducting type is p-type.

4. An organic electronic and opto-electronic device with an increased active junction area as defined in claim 1, wherein said first semiconductor elements and said second semiconductor elements, with at least one portion of either said first semiconductor elements or said second semiconductor elements being an organic semiconductor, are independently selected from a group of an inorganic compound, a mixture of inorganic compounds, an organic compound, a mixture of organic compound, or a mixture of organic compounds with inorganic compounds.

5. An organic electronic and opto-electronic device with an increased active junction area as defined in claim 1, wherein said organic semiconductor in either said first semiconductor elements or said second semiconductor elements is an organic compound or a mixture of organic compounds selected from a group of small molecules organic compounds, oligomers organic compounds, dendrimers or conductive polymers organic compounds and other organic materials having semiconductor properties.

6. An organic electronic and opto-electronic device with an increased active junction area as defined in claim 4, wherein said inorganic compounds are selected from a group of metal oxides, metallic sulfides, metallic selenide, silicon, porous silicates, zeolites, porous clays, carbon nano-rods, carbon nano-tubes and other inorganic materials of semiconductor properties.

7. An organic electronic and opto-electronic device with an increased active junction area as defined in claim 1, wherein said first semiconductor elements have a cross-sectional geometry selected from a group of cone, rod, tube, string, web form, framework, and irregular shape.

8. An organic electronic and opto-electronic device with an increased active junction area as defined in claim 1, further comprising a first contact layer on said first electrode, said first contact layer makes an electrical contact with said first semiconductor elements, for transporting of holes to said first semiconductor elements; and a second contact layer on said second electrode, said second contact layers makes an electrical contact with said second semiconductor elements, for transporting of electrons to said second elements.

9. An organic electronic and opto-electronic device with an increased active junction area as defined in claim 1, wherein said organic electronic and opto-electronic device being selected from a group of solar cells, thin film transistors, photodiodes, memory devices, and sensors.

10. An organic electronic and opto-electronic device with an increased active junction area as defined in claim 1, further comprising a second substrate for increasing lifetime stability, said second substrate is positioned and installed on said second electrode.

* * * * *